(12) United States Patent
Heffington et al.

(10) Patent No.: US 7,784,972 B2
(45) Date of Patent: Aug. 31, 2010

(54) THERMAL MANAGEMENT SYSTEM FOR LED ARRAY

(75) Inventors: Samuel N. Heffington, Austin, TX (US); Raghavendran Mahalingam, Austin, TX (US); Lee M. Jones, Austin, TX (US); Stephen Darbin, Austin, TX (US)

(73) Assignee: Nuventix, Inc., Austin, TX (US)

( * ) Notice: Subject to any disclaimer, the term of this patent is extended or adjusted under 35 U.S.C. 154(b) by 173 days.

(21) Appl. No.: 12/005,159

(22) Filed: Dec. 22, 2007

(65) Prior Publication Data

US 2008/0151541 A1    Jun. 26, 2008

Related U.S. Application Data

(60) Provisional application No. 60/876,860, filed on Dec. 22, 2006.

(51) Int. Cl.
*F21V 29/00* (2006.01)

(52) U.S. Cl. .................. 362/294; 362/231; 362/373; 362/249.06; 257/714

(58) Field of Classification Search .................. 362/294, 362/547, 373, 96, 101, 800, 231, 249.02, 362/97.1, 249.06, 249.14, 235; 257/714, 257/715; 361/688, 689; 165/149.19
See application file for complete search history.

(56) References Cited

U.S. PATENT DOCUMENTS

| 2003/0052584 A1* | 3/2003 | Matsui et al. .................. 313/24 |
| 2004/0190305 A1* | 9/2004 | Arik et al. .................... 362/555 |
| 2005/0168987 A1* | 8/2005 | Tamaoki et al. ............. 362/244 |
| 2005/0247947 A1* | 11/2005 | Owen et al. ................... 257/89 |
| 2006/0002143 A1* | 1/2006 | Gu et al. ..................... 362/612 |

* cited by examiner

*Primary Examiner*—Thomas M Sember
(74) *Attorney, Agent, or Firm*—John A. Fortkort; Fortkort & Houston P.C.

(57) ABSTRACT

A device, comprising (a) a chamber having a liquid disposed therein, (b) an LED array having a first surface which is in contact with said liquid, and (c) at last one actuator adapted to dislodge vapor bubbles from said first surface through the emission of pressure vibrations.

20 Claims, 18 Drawing Sheets

FIG. 1 -Prior Art-

Cell internal resistance as a function of area of heat source including finned area Cell internal resistance as a function of thermal conductivity of fluid inside
Die size of 10 x 10

THERMAL MANAGEMENT SYSTEM FOR LED ARRAY

CROSS REFERENCE TO RELATED APPLICATION

This application claims priority to U.S. Provisional Application No. 60/876,860 filed Dec. 22, 2006 bearing the same title and incorporated herein by reference in its entirety.

FIELD OF THE DISCLOSURE

The present disclosure relates generally to thermal management devices, and more particularly to methods for making synthetic jet ejectors.

BACKGROUND OF THE DISCLOSURE

Thermal management of heat-producing bodies is a concern in many different technologies. Particularly in microprocessors, the rise in heat dissipation levels accompanied by a shrinking thermal budget has resulted in the need for new cooling solutions beyond conventional thermal management techniques. In the microelectronics industry, for example, advances in technology have brought about an increase in transistor density and faster electronic chips. As electronic packages increase in speed and capability, the heat flux that must be dissipated to maintain reasonable chip temperatures has also risen. Thermal management is recognized as a major challenge in the design and packaging of state-of-the-art integrated circuits in single-chip and multi-chip modules.

One method for effective heat transfer is so-called "two-phase" heat transfer. Two-phase heat transfer involves, generally, the evaporation of a liquid in a hot region and the condensation of the resulting vapor in a cooler region. This type of cooling is a highly effective cooling strategy for at least three reasons. First, the liquid to vapor phase change greatly increases the heat flux from the heated surface. Second, the high thermal conductivity of the liquid medium, as opposed to that of air, enhances the accompanying natural or forced convection. A third reason for the efficient heat transfer that occurs during two-phase heat transfer is that buoyancy forces remove the vapor bubbles generated at the heated surface away from the heated surface.

Two-phase, or "boiling," heat transfer is known and has been studied for a number of years. Heat pipes and thermosyphons are examples of efficient heat transfer devices that have been developed to exploit the benefits of two-phase heat transfer. Immersion cooling, which involves the pool boiling of a working fluid on a heated surface, is another example of a two-phase cooling technology. U.S. Ser. No. 11/205,665 (Glezer et al.), entitled "Apparatus and Method for Enhanced Heat Transfer" and filed on Aug. 17, 2005, describes a cooling cell based on the submerged vibration-induced bubble ejection (VIBE) process in which small vapor bubbles attached to a solid surface are dislodged and propelled into the cooler bulk liquid. Such an approach capitalizes on the benefits of two-phase cooling, while improving on traditional methods of implementing two-phase heat transfer.

One particularly significant challenge in thermal management exists with respect to LED arrays. Such arrays are used in a variety of display systems. FIG. 1 depicts the optical construction of one known LED-based spatial light modulation (SLM) display system 100. The display system 100 includes a first light source 102, a second light source 103, and a third light source 104. The display system 100 also includes, along an optical axis AX, an illumination optical system IL, a DMD 106, and a projection optical system PL for projecting an image onto a projection surface 107. The light sources 102-104 and the DMD 106 operate according to instructions received from a system controller 120.

The light sources 102-104 each include an array of light emitting diodes (LEDs) for emitting a respective one of three primary colors. The first light source 102 includes an LED array for emitting blue light, the second light source 103 includes an LED array for emitting green light, and the third light source 104 includes an LED array for emitting red light. The light radiated from the light sources 102-104 is directed through the illumination optical system IL to the DMD 106. The illumination optical system IL comprises a plurality of optical elements for directing and smoothing the light from the light sources 102-104.

The illumination optical system IL includes collimating lenses 108-110 for collimating light from the light sources 102-104. Specifically, the blue light from the first light source 102 is collimated by a collimating lens 108, the green light from the second light source 103 is collimated by a collimating lens 109, and the red light from the third light source 104 is collimated by a collimating lens 110.

The illumination optical system IL also includes a pair of filter elements 112 and 113. The first filter element 112 passes the blue light and reflects the green light. The second filter element 113 passes the blue and green light and reflects the red light. The filter elements 112 and 113 may be optical elements having a dichroic surface for filtering. In order to improve a use efficiency of the light from the light sources 102-104, polarization converting means for aligning polarizing directions of the light from the light sources 102-104 may be provided, for example between the light sources 102-104 and the filter elements 112, 113.

The illumination optical system IL performs a function of smoothing the light from the light sources 102-104. Smoothing the light makes it possible to minimize the difference in brightness between axial and off-axial rays on the display surface of the DMD 106, thereby improving the brightness distribution uniformity. This smoothing of illumination light is achieved by an integrator rod 115. The illumination optical system IL further includes a relay lens unit RL for relaying light from the integrator rod 115 to the DMD 106. The relay lens unit RL includes a first relay lens 117 and a second relay lens 118.

The DMD 106 includes an array of tiny mirror elements, which together modulate the light received from the illumination optical system IL and transmit the modulated light to the projection optical system PL, where it can be focused for display on the projection surface 107, such as a screen. The DMD 106 is so constructed that each of its mirror elements is in one of two differently inclined states, namely either in an ON state or in an OFF state. The DMD 106 is configured such that only mirror elements in their ON state reflect the illumination light towards the projection optical system PL. Thus, the portion of the illumination light reflected by the mirror elements in their ON state passes through the projection optical system PL and eventually forms a display image on the projection surface 107.

In the spatial light modulation (SLM) display system 100 of FIG. 1, each of the light sources 102-104 is a significant heat source. As a general proposition, the performance properties of such a system may be improved by increasing the optical flux of the light sources 102-104. However, doing so increases the thermal load that must be dissipated by the display's thermal management system. Currently, the limitations of existing thermal management systems limits the optical flux permissible at the light sources 102-104. These limitations, in turn, place limitations on the performance of the SLM display system 100.

There is thus a need in the art for a thermal management solution which addresses these infirmities. In particular, there is a need in the art for a thermal management system which can accommodate increased thermal loads in devices which utilize LED arrays. There is further a need in the art for LED based systems which advantageously utilize such thermal management systems. These and other needs are met by the devices and methodologies described herein.

BRIEF DESCRIPTION OF THE DRAWINGS

Many aspects of the devices and methodologies disclosed herein may be better understood with reference to the following drawings. The components in the drawings are not necessarily to scale, emphasis instead being placed upon clearly illustrating the principles of the devices and methodologies depicted therein. Moreover, in the drawings, like reference numerals designate corresponding parts throughout the several views.

DETAILED DESCRIPTION

Figure 1:
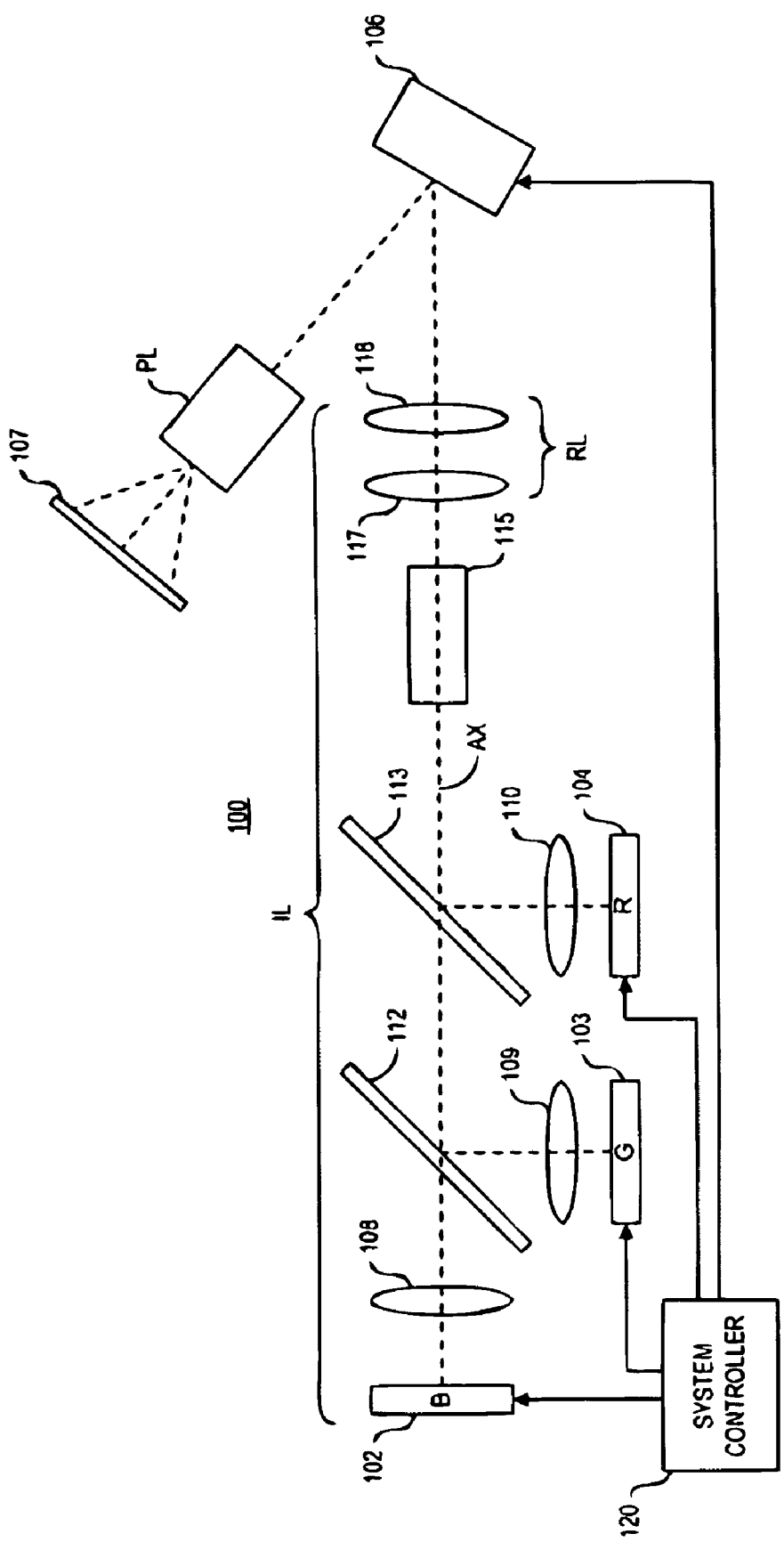
FIG. 1 is an illustration of a prior art LED illumination system.

In one aspect, a device is provided which comprises (a) a chamber having a liquid disposed therein, (b) an LED array having a first surface which is in contact with said liquid, and (c) at last one actuator adapted to dislodge vapor bubbles from said first surface through the emission of pressure vibrations.

In another aspect, a method for thermally managing an LED array is provided. In accordance with the method, a chamber is provided which comprises an LED array, said chamber having a liquid disposed therein. Vapor bubbles are caused to form on a surface of said LED array, and acoustic or pressure vibrations are emitted into the liquid, thereby dislodging the vapor bubbles from the surface of the LED array.

In a further aspect, a device is provided which comprises (a) an LED array having a light emitting surface, (b) an actuator array, and (c) a window, disposed in opposing relation to said light emitting surface; wherein said light emitting surface, said actuator array, and said window define a portion of a chamber having a liquid disposed therein, and wherein said actuator array is adapted to emit acoustic or pressure vibrations into said liquid.

In yet another aspect, a device is provided which comprises (a) a chamber having a liquid disposed therein; (b) an LED array; and (c) an actuator adapted to cool said LED array by atomizing said liquid.

In still another aspect, a device is provided which comprises (a) an LED array having a light emitting surface; (b) an actuator array; and (c) a window, disposed in opposing relation to said light emitting surface; wherein said light emitting surface, said actuator array, and said window define a portion of a chamber having a liquid disposed therein, and wherein said actuator array is adapted to atomize said liquid.

In yet another aspect, a device is provided which comprises (a) a first set of LED arrays adapted to emit light over a first principle bandwidth; (b) a second set of LED arrays adapted to emit light over a second principle bandwidth; and (c) a third set of LED arrays adapted to emit light over a third principle bandwidth; wherein each of said first, second, and third LED arrays comprise a plurality of LEDs disposed on a transparent substrate.

In a further aspect, a device is provided which comprises (a) a first set of LED arrays adapted to emit red light; (b) a second set of LED arrays adapted to emit green light; (c) a third set of LED arrays adapted to emit blue light; (d) a set of synthetic jet ejectors adapted to emit a plurality of synthetic jets across the light emitting surfaces of each member of said first, second and third sets of LED arrays; (e) a housing containing said first, second and third sets of LED arrays; and (f) a liquid disposed in said housing.

It has now been found that the aforementioned needs in the art may be met by configuring an LED-based device such that it can utilize a two-phase cooling system to thermally manage LED arrays. The two-phase cooling system may be based on vibration induced atomizers (VIDA) which utilize a source of heat transfer fluid, an atomizing surface adapted to receive a droplet of the heat transfer fluid thereon, and a driver which is configured to control a vibration of the atomizing surface at a frequency such that the atomizing surface forms a spray of atomized droplets from the droplet of the heat transfer fluid.

The two-phase cooling system may also be based on vibration-induced bubble ejection (VIBE) systems or processes in which small vapor bubbles attached to a solid surface are dislodged and propelled into the cooler bulk liquid. VIBE devices of the type described herein may exceed the performance of many conventional immersion cooling devices because they delay the onset of the critical heat flux. By forcibly removing the attached vapor bubbles with pressure instabilities, VIBE devices can dissipate more energy for a given surface temperature than many prior art immersion coolers.

Various other devices, methodologies and features are also disclosed herein which further enhance or facilitate the thermal management of LED arrays. These include, without limitation, various modifications to the collection optics and to the LEDs themselves. These features, alone or in the aggregate, may provide large flux cooling of LED arrays, more efficient light generation from LED arrays, fewer collection losses, and simplified collection optics (as, for example, by the combination of individual color LED arrays into a single LED array). The foregoing features and aspects are described in greater detail below.

Figure 2:
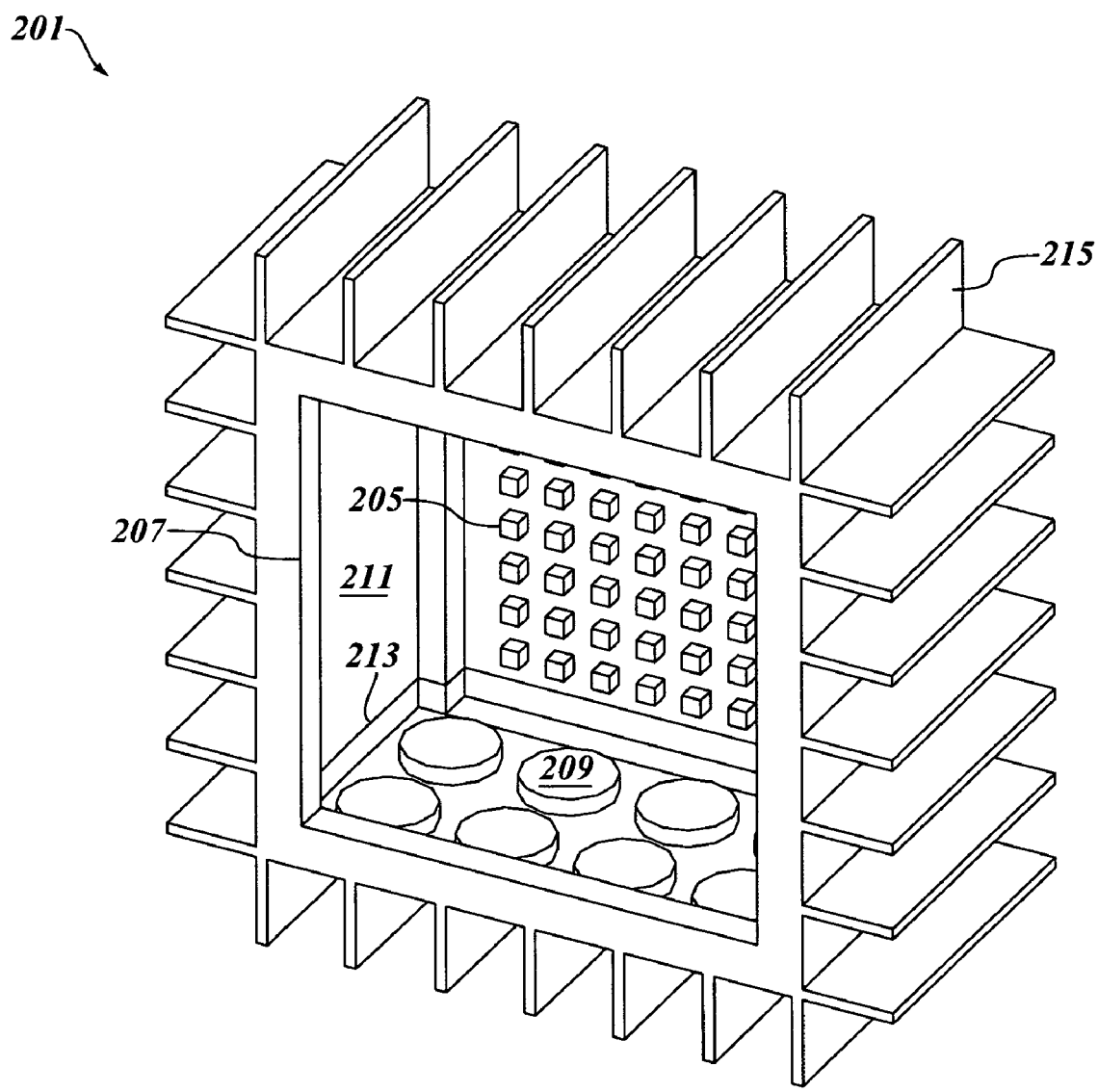
FIG. 2 is a perspective illustration of an LED thermal management system in accordance with the teachings herein which utilizes vibration induced atomization.

FIG. 2 illustrates a first particular, non-limiting embodiment of a VIDA device of the type described herein. The device 201 depicted therein comprises a housing 203 which encloses a chamber. The chamber has an LED array 205 disposed on one surface thereof, and has a window 207 disposed in opposing relationship thereto. The window 207 is preferably transparent to the wavelengths of interest that are generated by the LED array 205. An actuator array 209 is disposed along the bottom of the housing 203. The remaining interior surfaces of the housing are equipped with reflective surfaces 211 that are preferably reflective to the wavelengths of interest that are generated by the LED array 205. The chamber is further equipped with a reservoir 213 that holds a portion of liquid therein. In the particular embodiment depicted, the actuator array 209 is disposed within the reservoir 213.

Figure 3:
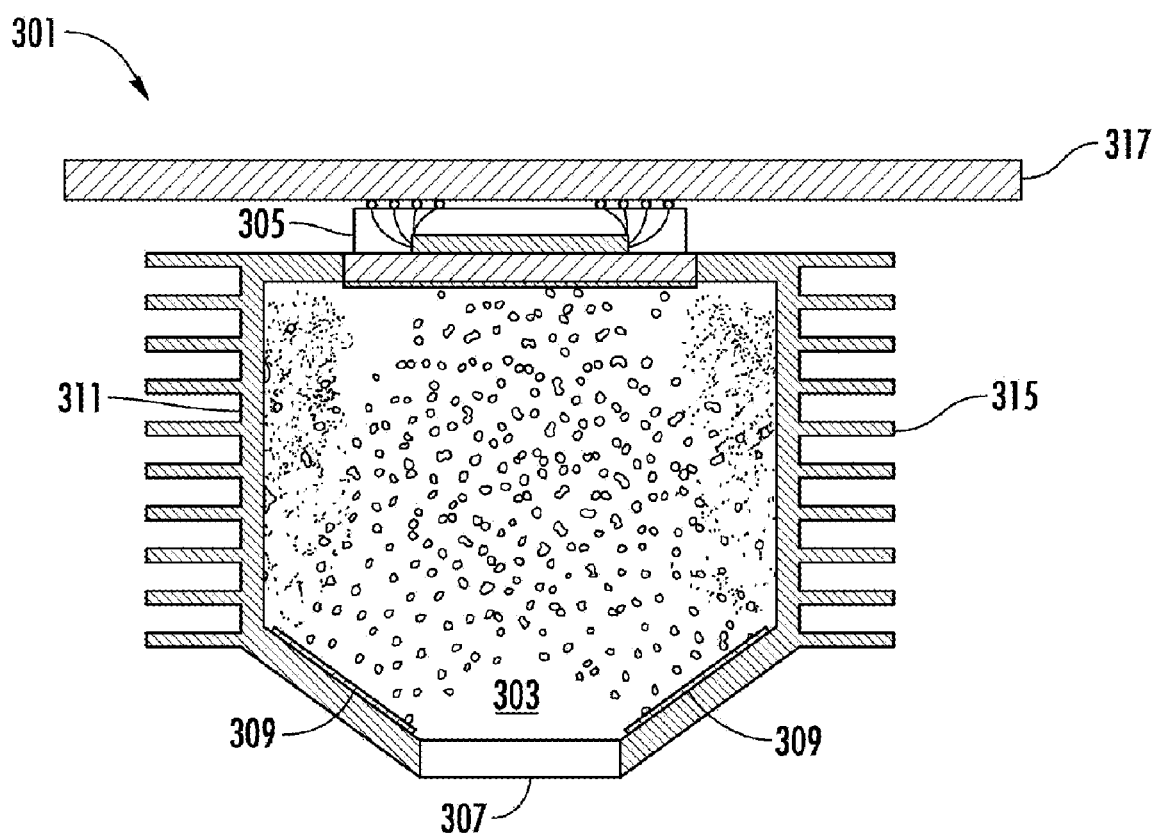
FIG. 3 is a cross-sectional illustration of an LED thermal management system in accordance with the teachings herein which utilizes vibration induced atomization.

FIG. 3 illustrates another particular, non-limiting embodiment of a VIDA device of the type described herein. The device 301 depicted therein comprises a housing 311 which encloses a chamber 303. The device contains an LED array 305 disposed on a substrate 317 which forms one wall of the chamber 303. The device is further equipped with a window 307 which is disposed in opposing relationship thereto. The window 307 is preferably transparent to the wavelengths of interest that are generated by the LED array 305. An actuator array 309 is disposed along portions of the wall 305 which are adjacent to the window 307. As in the previous embodiment, the remaining interior surfaces of the housing are equipped with reflective surfaces that are preferably reflective to the wavelengths of interest that are generated by the LED array 305.

The operation of the VIDA device 301 of FIG. 3 is similar to the operation of the VIDA device 201 in FIG. 2. In operation, the VIDA device 301 dissipates heat generated by the LED array 305 through the generation of droplets of a heat transfer fluid. These droplets form a thin film of fluid on the LED array 305, which then absorbs heat from the LED array 305 by undergoing evaporation. The resulting vapor then condenses on the walls 311 of the chamber 303, thereby transferring the heat absorbed from the LED array 305 to the heat transfer fins 315.

The VIDA devices 201 and 301 of FIGS. 2 and 3, respectively, have extended exterior surfaces which, in the particular embodiments depicted, comprise a plurality of heat transfer fins (215 and 315) for transferring heat from the interior of the device to the external environment. The heat transfer fins are in thermal contact with the interior of the device, and may comprise aluminum, copper, graphite, metal filled polymeric compositions, and other such materials with suitably high heat transfer coefficients. Although it is not specifically shown, in some embodiments, one or more synthetic jet actuators may be provided which are adapted to direct a plurality of synthetic jets along the channels formed by adjacent fins. Such synthetic jet actuators may be equipped with various manifolds or conduits. Some specific, non-limiting examples of such actuators, manifolds and conduits are described, for example, in commonly assigned U.S. Ser. No. 11/325,239, entitled "SYSTEM AND METHOD FOR THERMAL MANAGEMENT USING DISTRIBUTED SYNTHETIC JET ACTUATORS", which is incorporated herein by reference in its entirety.

The VIDA devices of FIGS. 2-3 offer some unique advantages over other systems known to the art for the thermal management of LED arrays. In particular, the VIDA devices employ thin film evaporation directly on the LED array, which thus promotes direct and highly efficient heat transfer therefrom. In particular, and in contrast to thermal management systems that utilize heat pipes or heat siphons, in the VIDE devices depicted, there is typically no vapor layer between the thermal management fluid and the heated surface. Hence, localized heating of the surface of the LED array is avoided, and comparatively large heat fluxes may be obtained.

Further advantages that may be obtained with the VIDA devices of FIGS. 2-3 include the reduction or elimination of parasitic contact resistances. These devices may also provide low junction temperatures which may be achieved at reduced cell pressures, and reduced temperature gradients on power components. Also, the VIDA devices described herein will operate properly regardless of orientation and external forces, and hence are gravity independent. This last property makes them especially suitable for use in aircraft, spacecraft, and other such devices in which lo gravity situations may be encountered, or in which gravity may fluctuate significantly.

Various atomizers or actuators may be used in the VIDA devices of FIGS. 2-3. These include, without limitation, various piezoelectric, electromagnetic, electrostatic, or mechanically driven devices. Preferably, these atomizers are low power devices which offer fast response times for on-demand cooling. The droplet diameters achievable with these atomizers may vary, and optimal droplet diameter may differ from one application to another. Preferably, however, the mean droplet diameter will be within the range of about 5 to about 400 microns.

Figure 4:
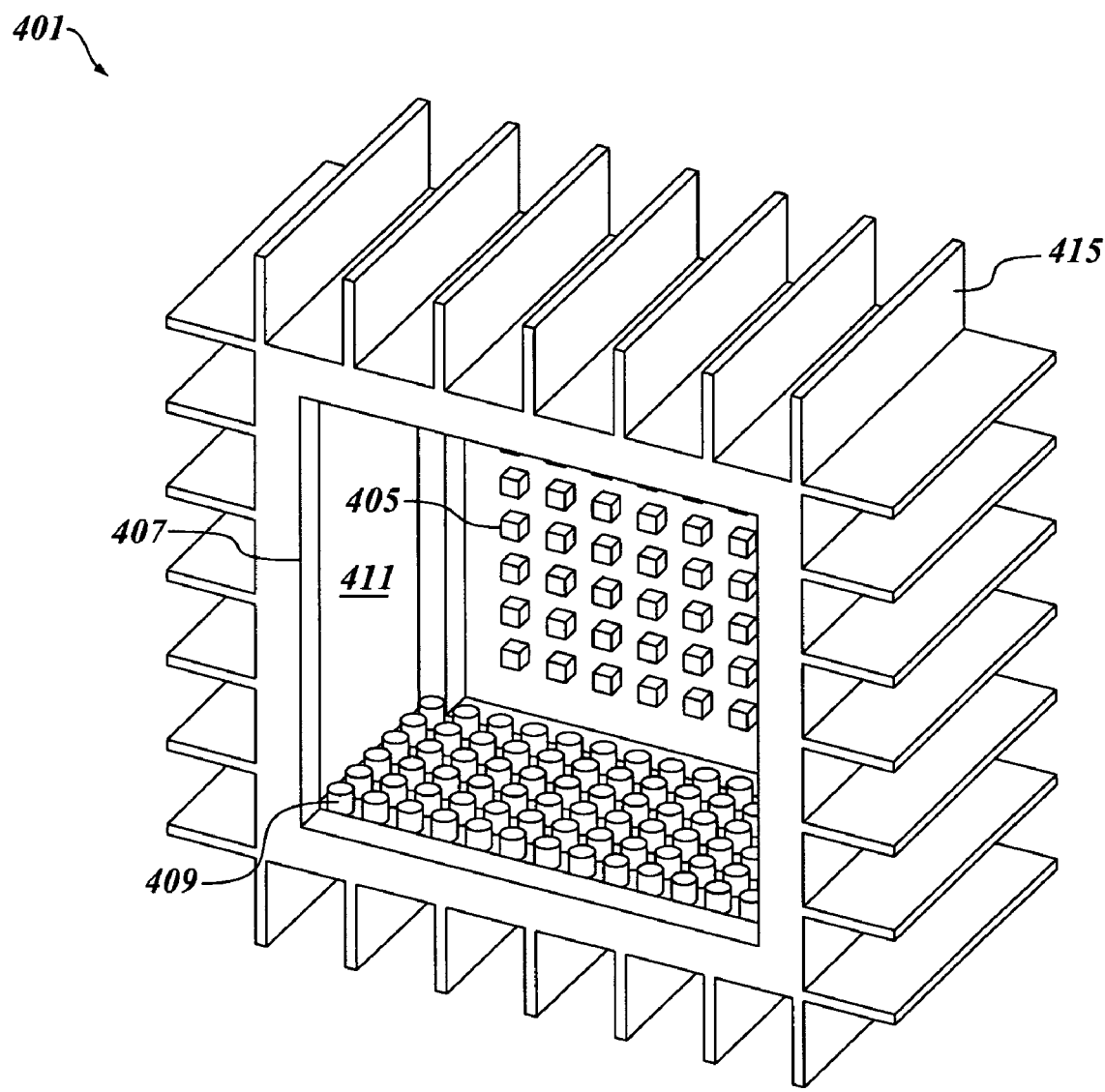
FIG. 4 is an illustration of an LED thermal management system in accordance with the teachings herein which utilizes vibration enhanced boiling.

FIG. 4 illustrates a particular, non-limiting embodiment of a VIBE device of the type described herein. The device 401 depicted therein comprises a housing which encloses a chamber 403. The chamber 403 has an LED array 405 disposed on one surface thereof, and has a window 407 disposed in opposing relationship thereto. The window 407 is preferably transparent to the wavelengths of interest that are generated by the LED array 405. An actuator array 409 is disposed along the bottom of the chamber 403. The remaining interior surfaces of the chamber are equipped with reflective surfaces 411 that are preferably reflective to the wavelengths of interest generated by the LED array 405.

Figure 5:
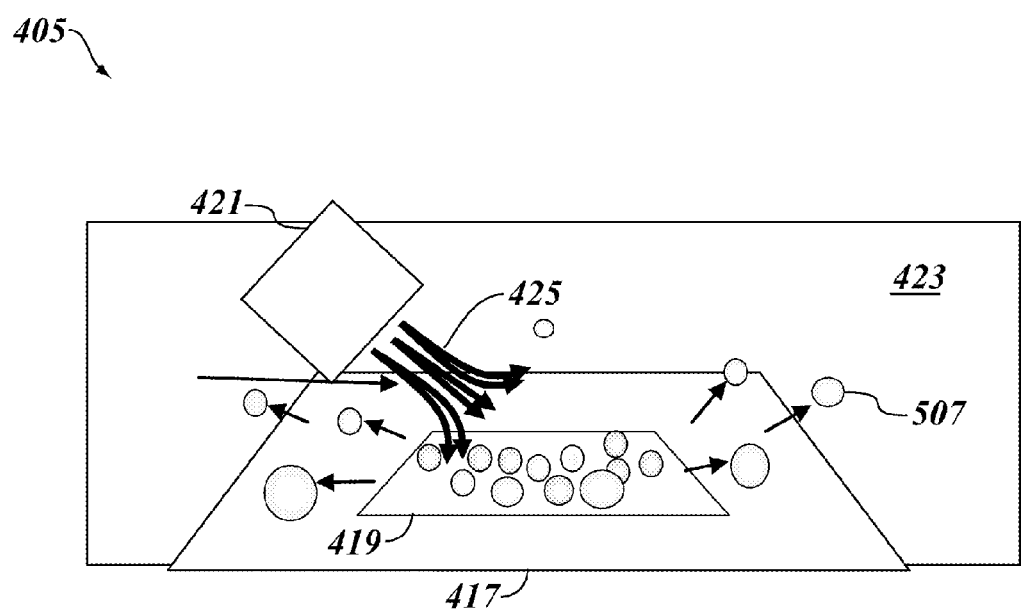
FIG. 5 is an illustration of an LED thermal management system in accordance with the teachings herein which utilizes vibration enhanced boiling.

FIG. 5 illustrates the basic operation of a VIBE device of the type illustrated in FIG. 4. As seen therein, each individual LED 419 within the LED array 405 is disposed on a substrate 417. One or more of the individual actuators 421 within the actuator array 409 acts to direct one or more submerged, high speed, vibration-induced, turbulent synthetic jets onto or across the surface of the individual LED 419 within the LED array 405. This has the effect of causing a phase change heat transfer by removing nucleate vapor bubbles into the cooler bulk thermal management fluid, where they will typically undergo condensation. Hence, the jet impingement afforded by the VIBE device enhances vapor nucleation. Moreover, by providing a turbulent flow of fluid in the vicinity of the individual LEDs 419 within the LED array 405, the synthetic jets disrupt the formation of an insulating vapor layer over the surface of the LED array 405, and hence enhance thermal transfer between the LED array 405 and the thermal management fluid. The synthetic jets also serve to stir the pool of thermal management fluid, thereby enabling the pool to efficiently move heat to the surface of the cell.

It is notable that the VIBE devices described herein will operate properly regardless of orientation and external forces, and hence are gravity independent. This property makes them especially suitable for use in aircraft, spacecraft, and other such devices in which lo gravity situations may be encountered, or in which gravity may fluctuate significantly. As with the VIDA devices described above, the VIBE devices may be provided with fins 415 (see FIG. 4) and other extended surfaces to facilitate heat transfer between the thermal management fluid and the external environment, and these extended surfaces may be used in conjunction with one or more synthetic jet ejectors as described above in reference to the VIDA devices.

Figure 6:
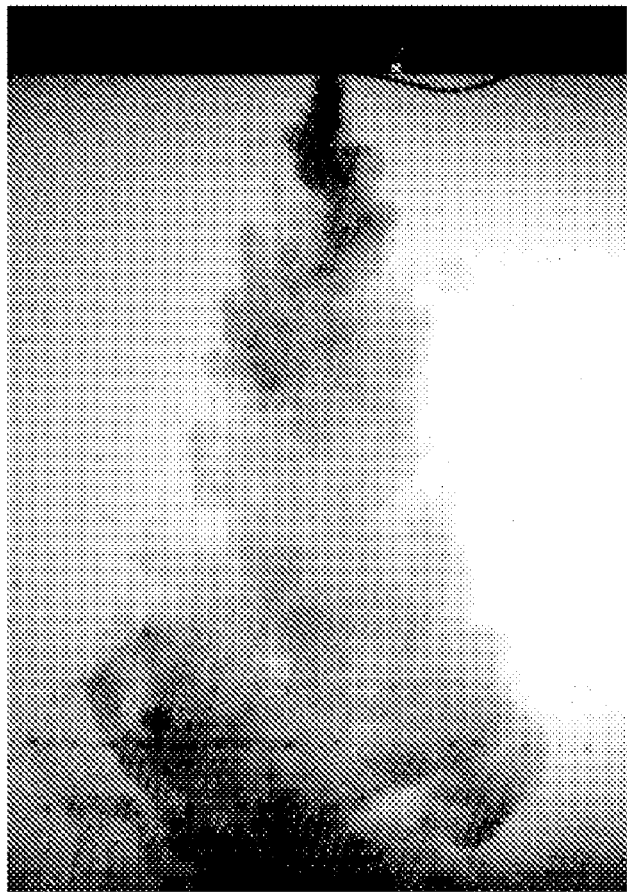
FIG. 6 is a photomicrograph of a synthetic jet.

A particular, non-limiting example of a synthetic jet which may be generated in the VIBE devices described herein is depicted in the photomicrograph depicted in FIG. 6. Such a submerged, turbulent synthetic jet may be formed, for example, on the surface of a circular, vibrating piezoelectric diaphragm. The time-harmonic pressure oscillations near the diaphragm center result in the cyclical formation and disappearance of cavitation bubbles. The formation and collapse of these bubbles leads to entrainment of the surrounding liquid that generates a high-speed (e.g., 0.5 m/sec) turbulent jet.

The synthetic jet depicted in FIG. 6 has some unique attributes. In particular, the jet creates finite, linear streamwise momentum in the thermal management fluid which consists entirely of entrained fluid. The width and centerline velocity of the synthetic jet are typically linear functions of the distance from the diaphragm to the driver.

Figure 7:
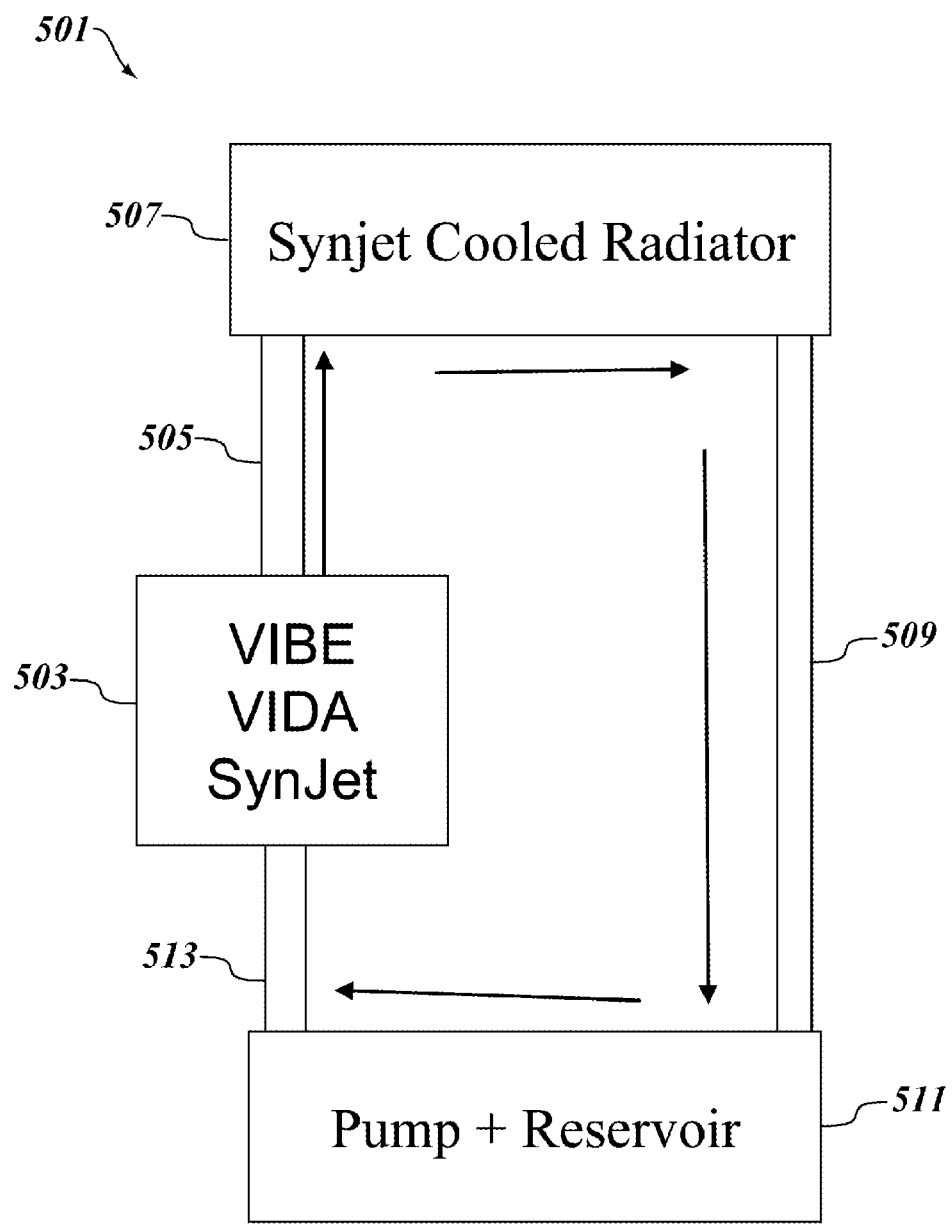
FIG. 7 is a schematic illustration of a thermal management system in accordance with the teachings herein.

FIG. 7 illustrates a thermal management system 501 which may be used in conjunction with heat transfer cells of the type described herein. Hence, the system 501 comprises a heat transfer cell 503 which may be, for example, any of the VIBE or VIDA systems described above, including those illustrated in FIGS. 2-5, or which, more generally, may be any suitable fluidic synthetic jet system. As seen therein, the heat transfer cell 503 is in fluidic communication with a first conduit 505 that serves to transfer hot fluid (which may be a liquid or vapor) exiting the cell to a radiator 507. The radiator 507 is preferably cooled with one or more synthetic jets.

A second conduit 509 is provided which transfers the cooled fluid from the radiator 507 to a reservoir 511. From there, the fluid flows back into the heat transfer cell 503 by way of a third conduit 513. The thermal management system 501 is preferably equipped with a suitable pumping mechanism and/or system of valves to create or maintain a flow of fluid through the system. However, in some embodiments, this may be accomplished solely through thermal gradients.

The use of a thermal management system of the type depicted in FIG. 7 with heat transfer cells of the type disclosed herein has some notable advantages. In particular, the use of such a system permits the air side heat exchanger to be located in a remote location. This allows for much smaller LED array cells, and potentially easier optical collection.

Figure 8:
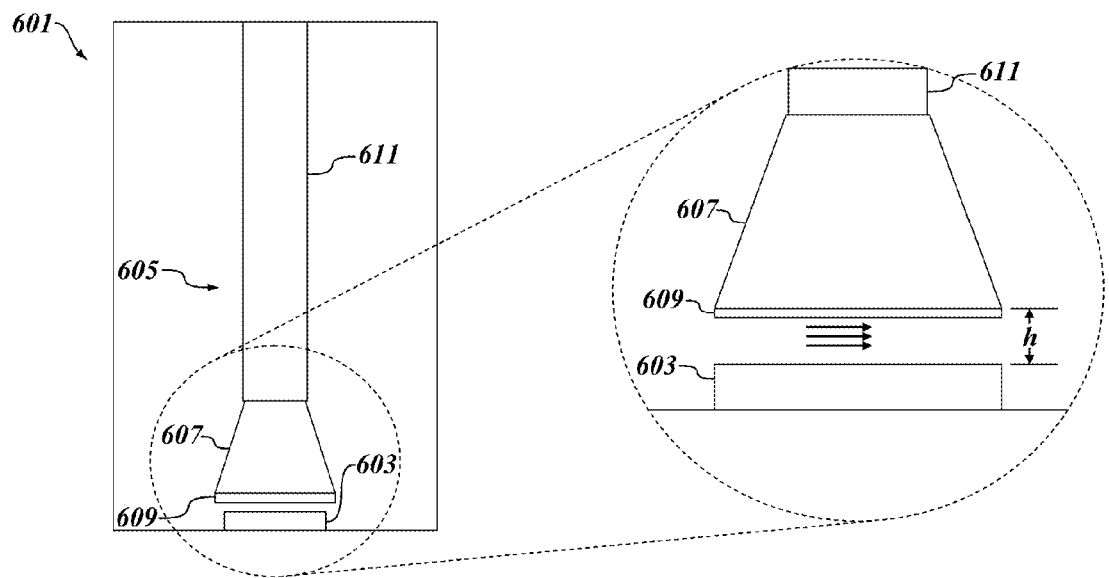
FIG. 8 is a schematic illustration of a device in accordance with the teachings herein in which collection optics are disposed adjacent to an LED such that a turbulent flow of fluid can be maintained in the gap between them.

FIG. 8 depicts a further particular, non-limiting embodiment of an LED device in accordance with the teachings herein. The LED device 601 depicted therein comprises an LED array 603 disposed in spaced-apart relation to a set of collection optics 605. The collection optics 605 comprises a sealed, evacuated chamber 607 which has a window 609 on one side thereof, and which is in optical communication with a light guide 611 on the opposing side. The height h of the gap between the LED array 603 and the window 609 of the collection optics 605 is preferably sufficiently small to minimize optical losses, while still allowing a turbulent flow of heat transfer fluid through the gap. As described above, this flow of fluid is preferably facilitated with one or more synthetic jets.

Figure 9:
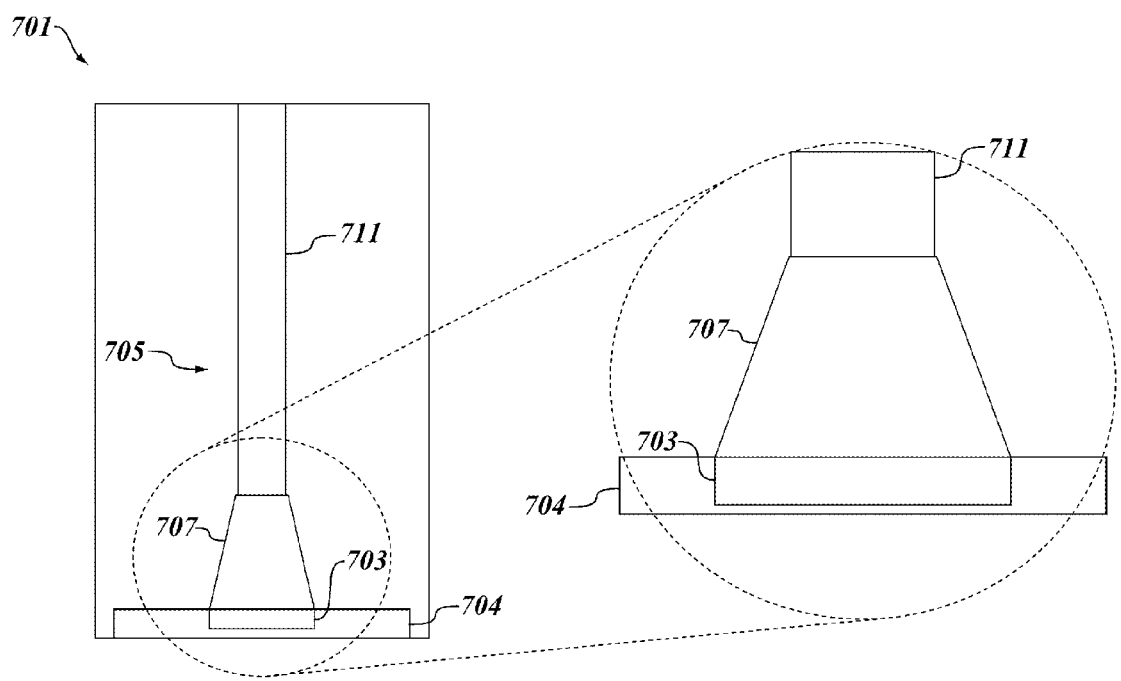
FIG. 9 is a schematic illustration of a device in accordance with the teachings herein in which collection optics are disposed in contact with an LED, and in which a heat spreader is utilized to transfer heat from the interface to a heat transfer fluid.

FIG. 9 depicts another particular, non-limiting embodiment of an LED device in accordance with the teachings herein. The LED device 701 depicted therein comprises an LED array 703 which is disposed in a heat spreader, and which is in contact with a set of collection optics 705. The collection optics 705 comprises a sealed, evacuated chamber 707 which encompasses the LED array 703, and which is in optical communication with a light guide 711 on the opposing side.

In the LED device 701 depicted in FIG. 9, the collection optics 705 are in contact with the LED array 703. Consequently, no fluid passes between the collection optics 705 and the LED array 703, which, in some embodiments, may be favorable from an optical loss standpoint. The heat spreader 704 acts to withdraw heat from the LED array 703, where it may be dissipated with the help of synthetic jet actuators, VIBE devices, or VIDA devices as disclosed herein. In some embodiments, the heat spreader 704 may be equipped with features to increase its surface area.

Figure 10:
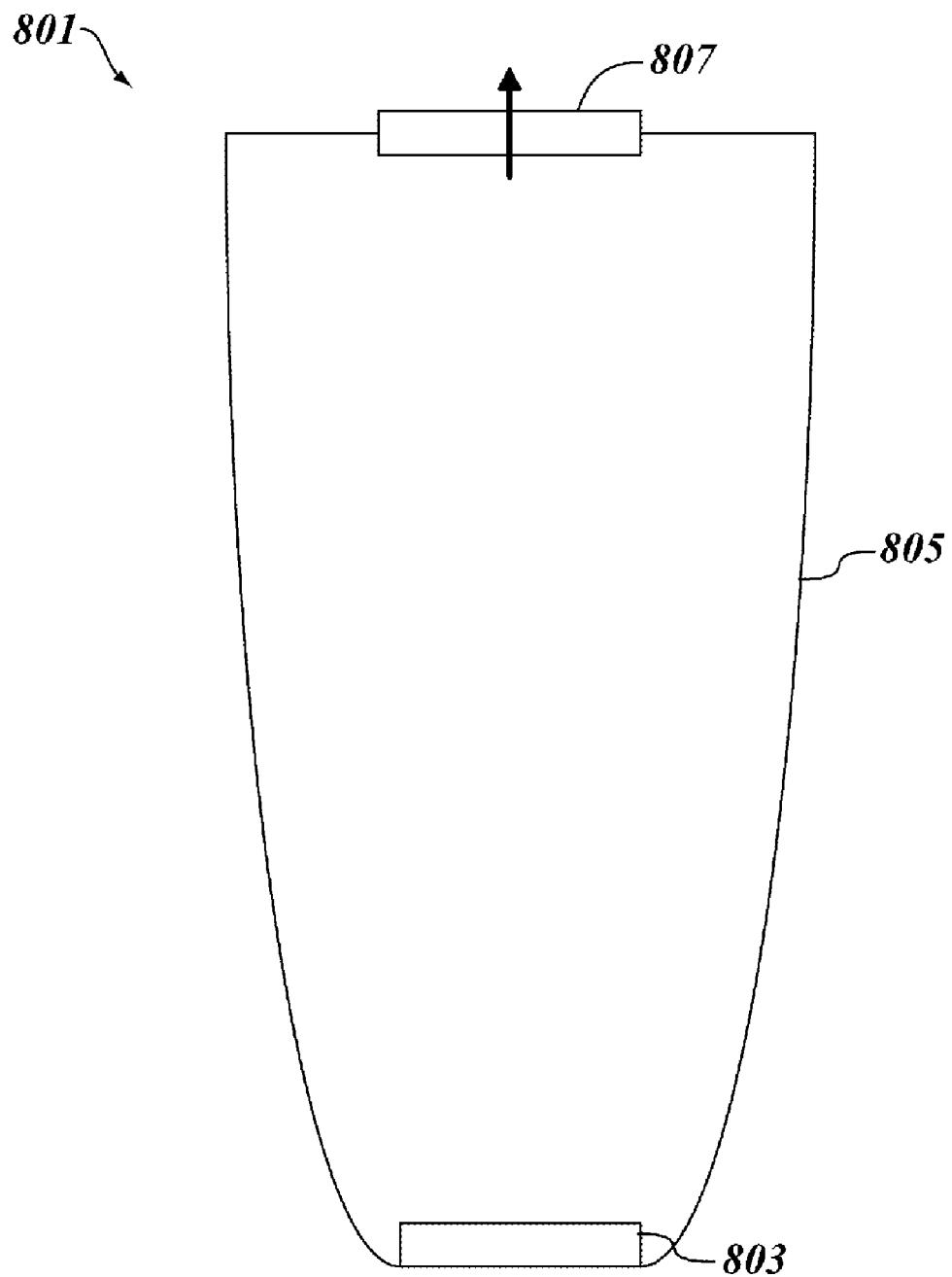
FIG. 10 is a schematic illustration of a device in accordance with the teachings herein in which features an LED array disposed in a chamber equipped with an integral reflector.

FIG. 10 illustrates another particular, non-limiting embodiment of an LED device made in accordance with the teachings herein. The LED device 801 depicted therein comprises an LED array 803 which is disposed within a housing 805. The housing 805 is equipped with a window 807 on one end through which light exits. The housing 805 of the LED device 801 depicted in FIG. 10 has inner walls which are suitably reflective. These inner walls may be coated with silver, or equipped with another suitably reflective material, such as a multilayer polymeric mirror film. Examples of multilayer polymeric mirror films which may be suitable for this purpose include those disclosed, for example, in U.S. Pat. No. 5,882,774 (Jonza et al.).

The housing 805 of the LED device 801 may be appropriately shaped to minimize light loss as light travels from the LED array 803 to the window 807. In some embodiments, the housing 805, or the inner walls thereof, may be adaptive or active so that they can respond to different conditions for LED light emission.

Figure 11:
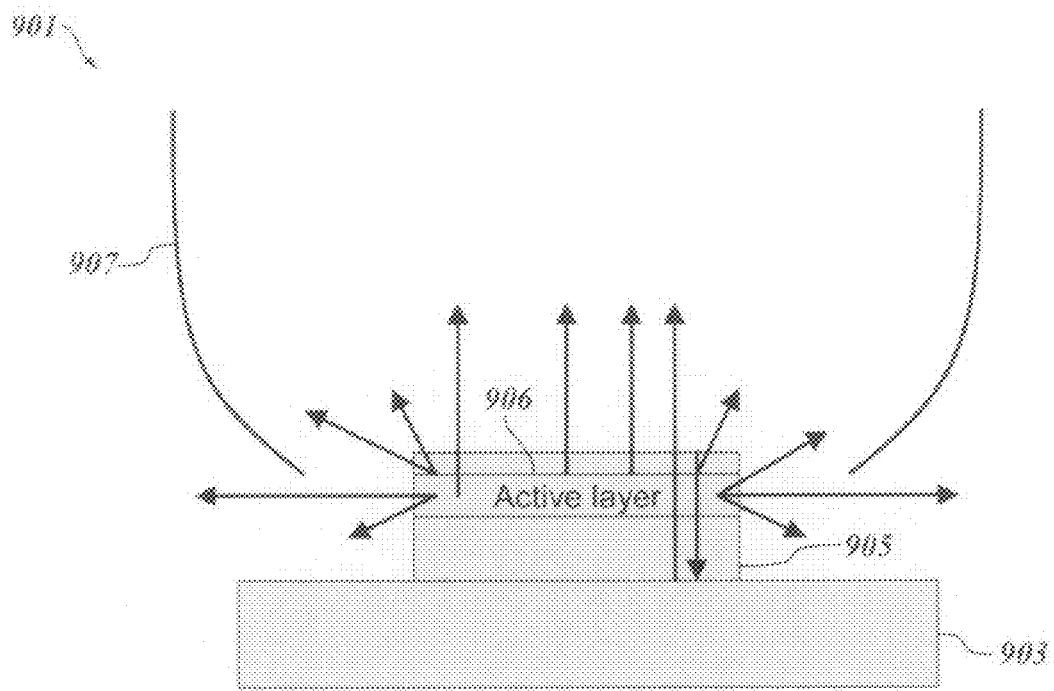
FIG. 11 is an illustration of a conventional "short stack" LED which is designed to minimize thermal resistance out of the back of the device and to a heat transfer fluid.
Figure 12:
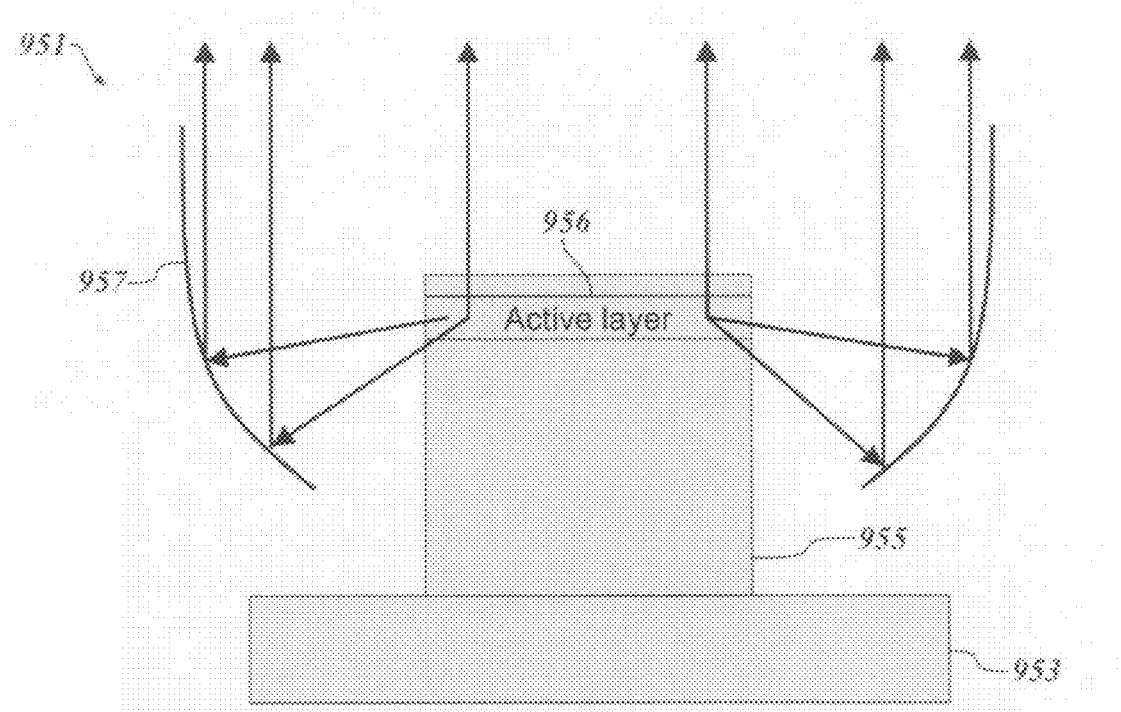
FIG. 12 is an illustration of a "tall stack" LED which is designed to maximize light output and surface area for front side cooling.

FIGS. 11-12 illustrate a further method in accordance with the teachings herein by which light may be more effectively collected from an LED. FIG. 11 depicts a conventional LED assembly 901. As seen therein, the LED assembly 901 comprises a substrate 903 upon which is disposed an LED array 905. The LED array 905 contains an active layer 906 from which light is emitted, and the LED assembly 901 is equipped with a reflector 907 for collecting the light emitted by the LED array 905. The thickness of the LED array 905 is typically minimized so as to minimize thermal resistance out of the back of the LED array 905. Consequently, the reflector 907 typically cannot be placed sufficiently low to collect side leakage of light from the LED array 905.

FIG. 12 depicts a particular, non-limiting embodiment of an LED assembly made in accordance with the teachings herein. The LED assembly 951 depicted therein comprises a substrate 953 upon which is disposed an LED array 955. The LED array 955 contains an active layer 956 from which light is emitted, and the LED assembly 951 is equipped with a reflector 957 for collecting the light emitted by the LED array 955. In contrast to the LED array 905 of FIG. 11, the thickness of the LED array 955 in FIG. 12 has been increased so as to make the LED array 955 taller. Consequently, the reflector 957 is able to collect more of the light emitted from the LED array 955.

Moreover, the LED array 955 has increased surface area, which provides for greater heat dissipation by providing more surface area for the thermal management fluid to contact. Hence, this approach provides enhanced front-side cooling. As a result, the LED array 955 may offer lower thermal resistance for cooling, and hence higher levels of power dissipation. This, in turn, may permit more current to be run through the LED array 955, thus boosting light output even further.

Figure 13:
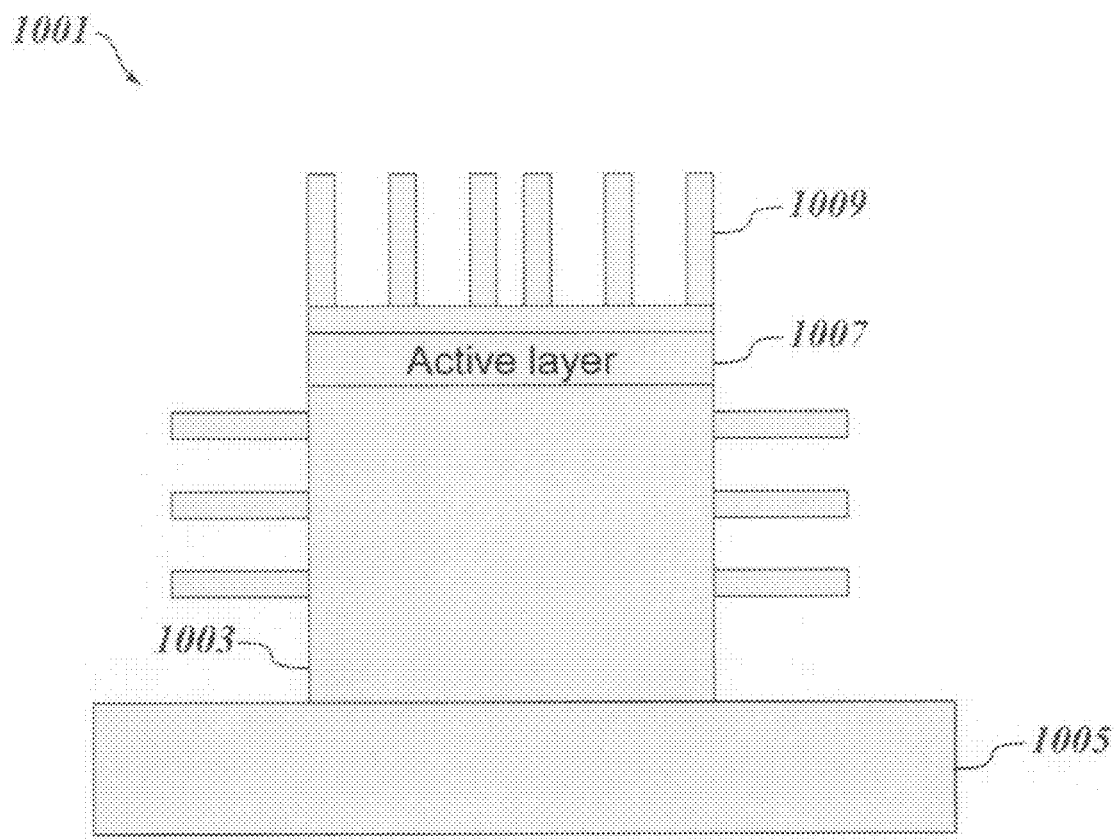
FIG. 13 is an illustration of a "tall stack" LED in accordance with the teachings herein which is equipped with heat dissipation fins.

FIG. 13 illustrates some of the advantages attendant to a "tall" LED array of the type depicted in FIG. 12. The LED assembly 1001 depicted in FIG. 13 comprises an LED array 1003 which is mounted on a substrate 1005, and which contains an active layer 1007 from which light is emitted. The LED array 1003 in this particular embodiment is equipped with a plurality of fins 1009 which aid in front-side heat dissipation, it being understood that other extended surfaces could be used to similar effect. The extended surfaces may comprise fiber optic tubes or other optical materials, or may comprise optically inactive materials which are optimized for heat dissipation. The extended surfaces may be formed during fabrication of the LED array 1003 through suitable masking and etching techniques.

Figure 14:
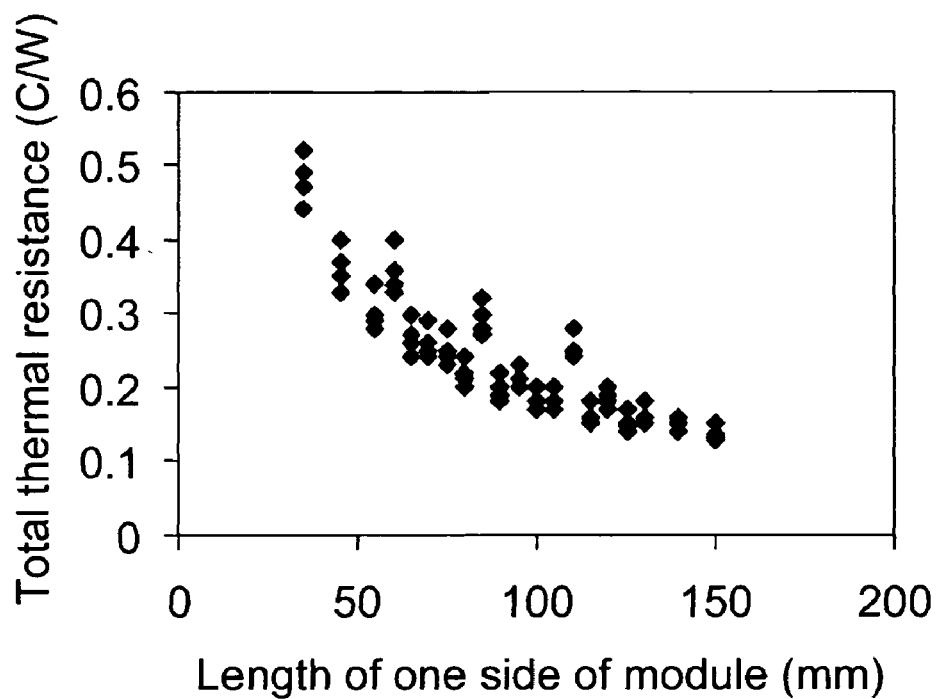
FIG. 14 is a graph of total thermal resistance as a function of the length of one side of a module.
Figure 15:
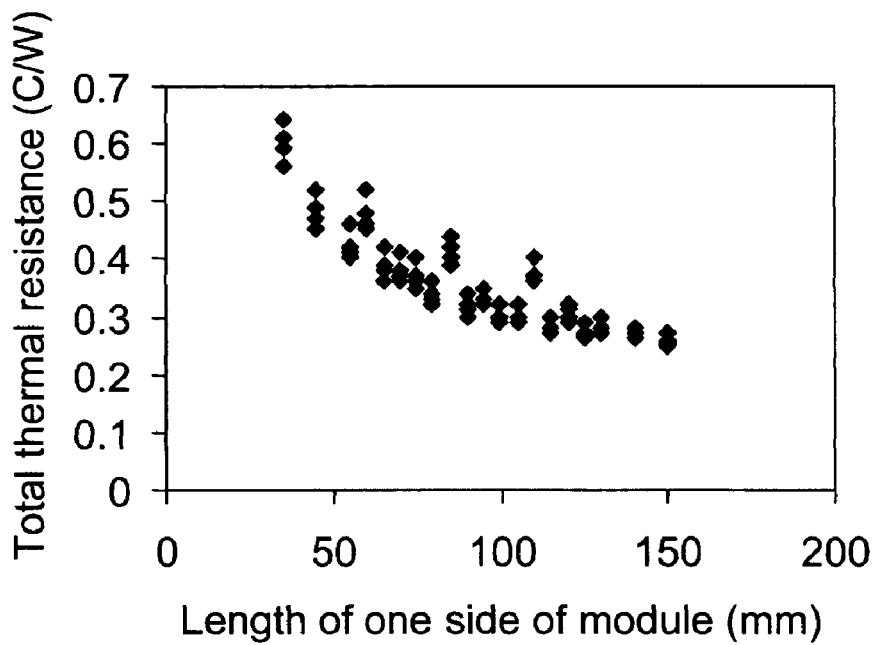
FIG. 15 is a graph of total thermal resistance as a function of the length of one side of a module.

FIGS. 14-15 depict the total thermal resistance (C/W) for a VIDA device of the type disclosed herein, and utilizing front side cooling (that is, cooling of the type utilized in the devices of FIGS. 4-5). FIG. 14 shows the results obtained when the cell is filled with water, while FIG. 15 shows the results obtained when the cell is filled with a fluorocarbon. The die size was 10 mm by 10 mm.

As seen through comparison of FIGS. 14 and 15, the use of water gave slightly lower thermal resistances. In each case, thermal resistance was dominated by the airside of the device, thus underscoring the advantages that may be provided through the provision of one or more synthetic jet ejectors to cool the exterior of the device.

Figure 16:
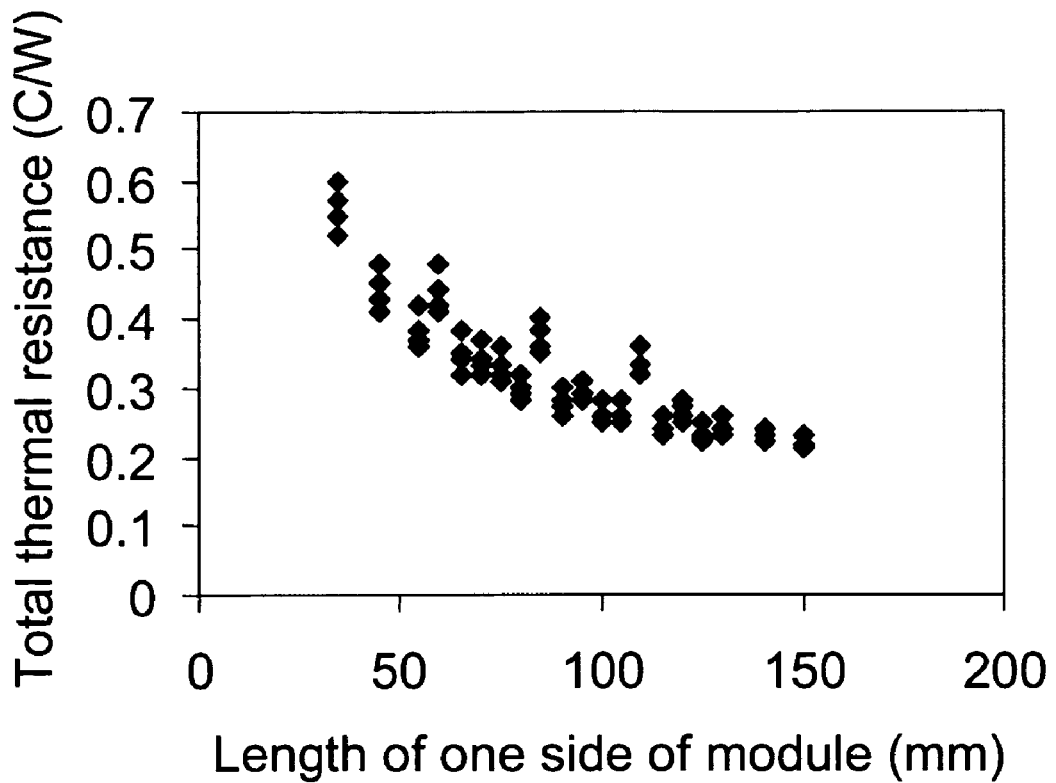
FIG. 16 is a graph of total thermal resistance as a function of the length of one side of a module.
Figure 17:
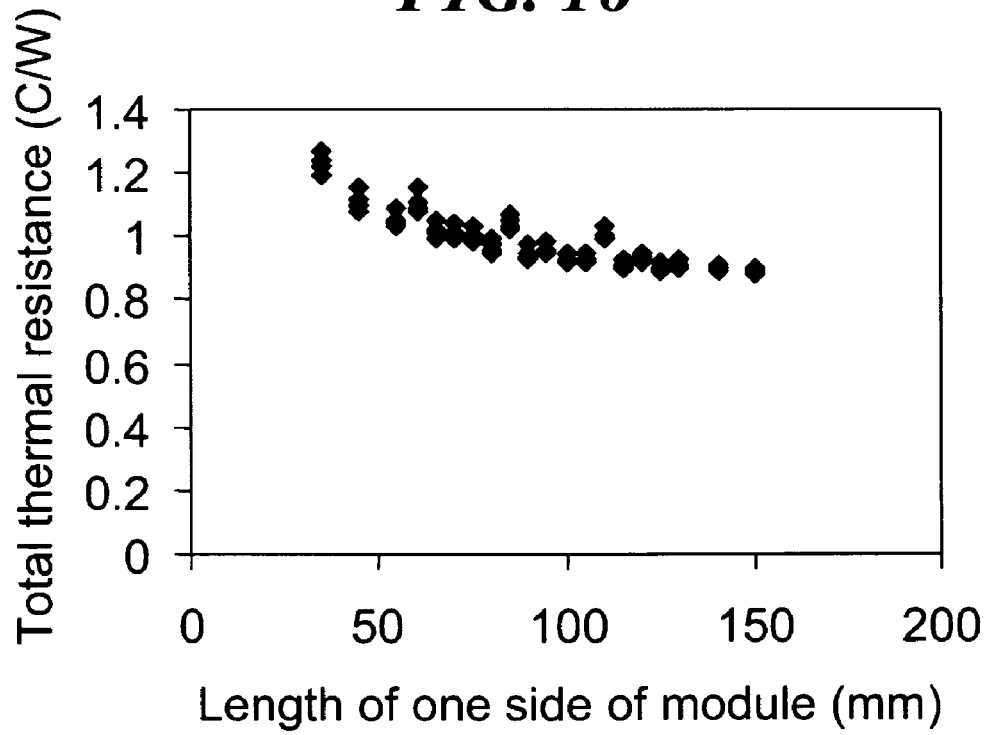
FIG. 17 is a graph of total thermal resistance as a function of the length of one side of a module.

FIGS. 16-17 depict the total thermal resistance (C/W) for a submerged jet device of the type disclosed herein, and utilizing front side cooling (that is, cooling of the type utilized in the devices of FIGS. 4-5). FIG. 16 shows the results obtained with a die size of 35 mm by 35 mm, and with the airside and internal thermal resistance of the same order. FIG. 17 shows the results obtained with a die size of 10 mm by 10 mm, and with the thermal resistance dominated by the area of the heat source.

Figure 18:
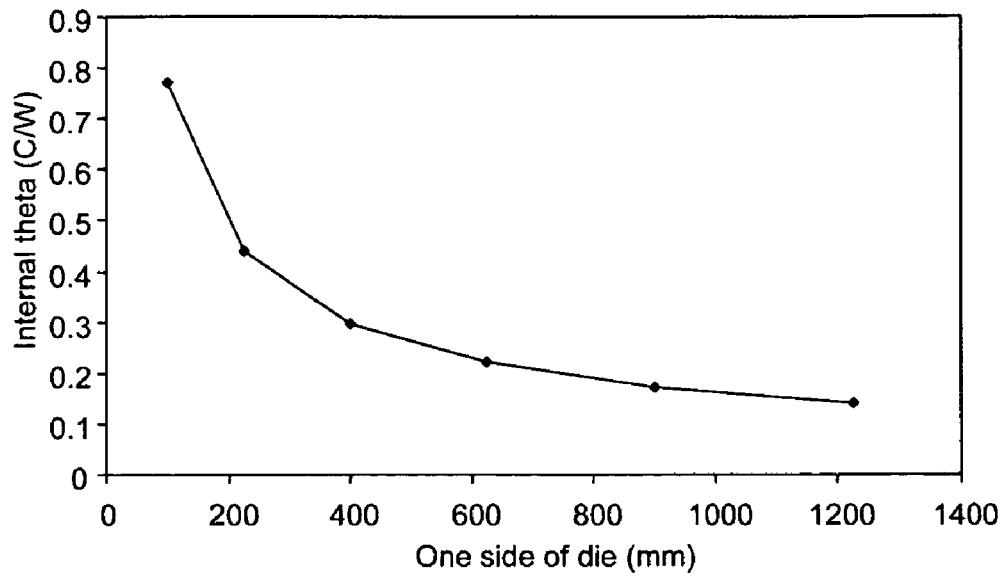
FIG. 18 is a graph of cell internal resistance as a function of area of heat source (for one side of a semiconductor die) including finned area.

FIG. 18 depicts the internal thermal resistance (C/W) as a function of the area of the heat source (including the finned area) for a device of the type depicted in FIG. 4 and being equipped with a submerged jet. As seen therein, internal resistance increases markedly as the size of the die decreases.

Figure 19:
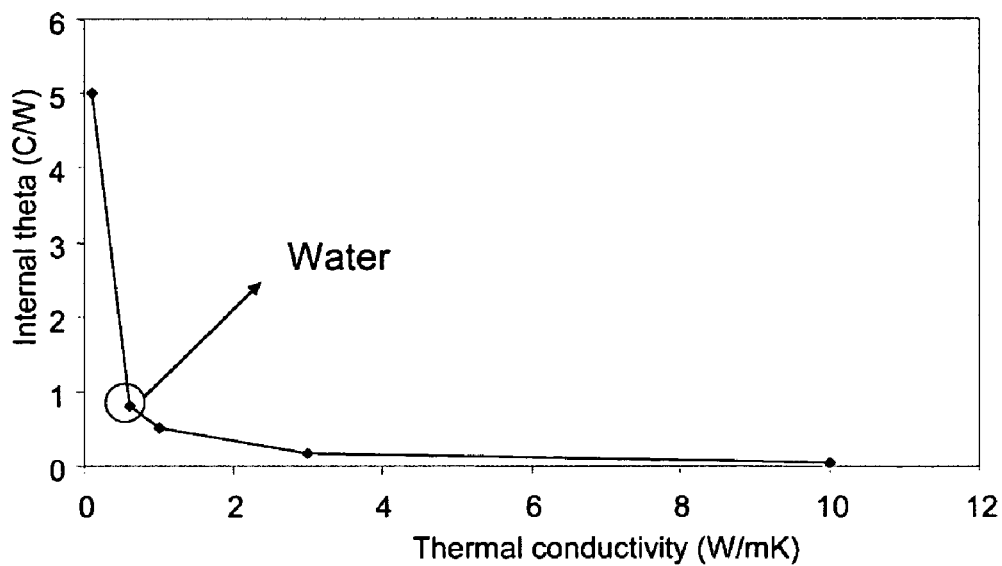
FIG. 19 is a graph of cell internal resistance as a function of the thermal conductivity inside of a die for a die size of 10×10.

FIG. 19 depicts the internal thermal resistance (C/W) as a function of the thermal conductivity of the fluid inside the device, and assuming a die size of 10 mm by 10 mm for a device of the type depicted in FIG. 4 which is equipped with a submerged jet. The location of water on this graph is indicated. As seen therein, internal resistance decreases markedly as the thermal conductivity of the fluid decreases. However, the effect is not linear, such that further decreases in cell internal resistance as may be obtained with fluids having lower thermal conductivities than water are predicted to be relatively modest.

Figure 20:
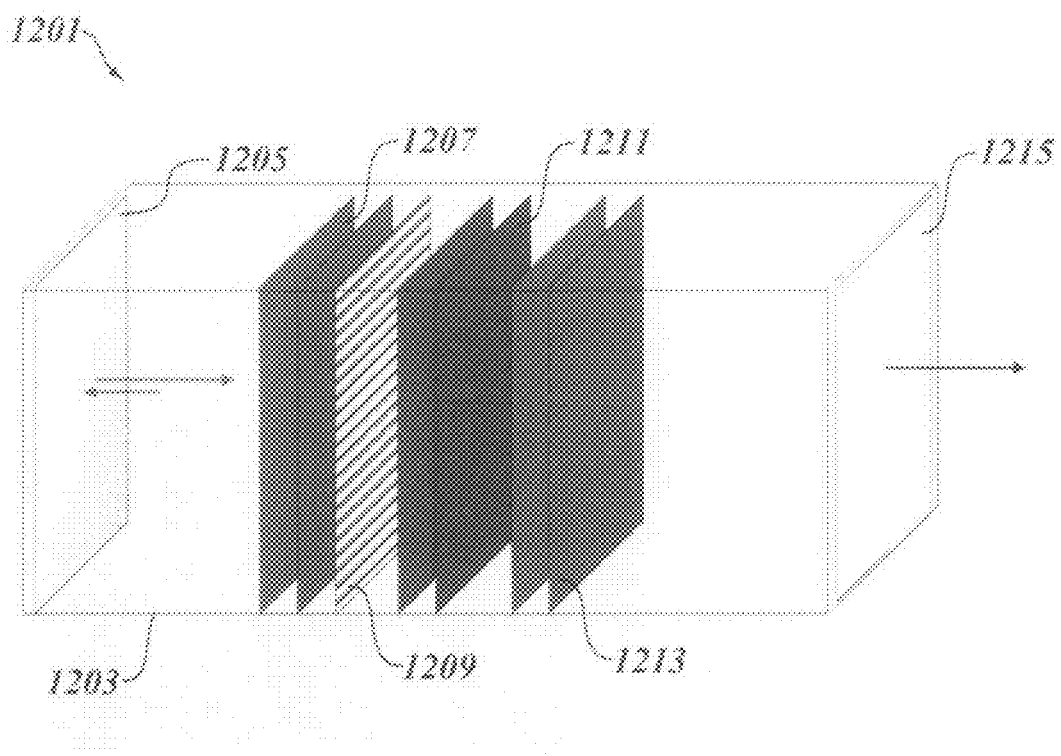
FIG. 20 is an illustration of an LCD assembly in accordance with the teachings herein.

FIG. 20 depicts a particular, non-limiting embodiment of an LED optics assembly 1201 made in accordance with the teachings herein. As seen therein, the assembly includes a box 1203 within which are housed multiple red 1207, blue 1211 and green 1213 LED arrays. A dichroic filter 1209, which is adapted to reflect blue and green light and to pass red light, is disposed between the red 1207 and blue 1211 arrays. A reflector 1205 is disposed on the back wall of the assembly 1201. Preferably, the remaining interior walls of the assembly 1201 will also be equipped with reflectors or will comprise a reflective material. As indicated in FIG. 20, multiple LED arrays may be packaged in this design, which can have the effect of boosting light output dramatically.

Figure 21:
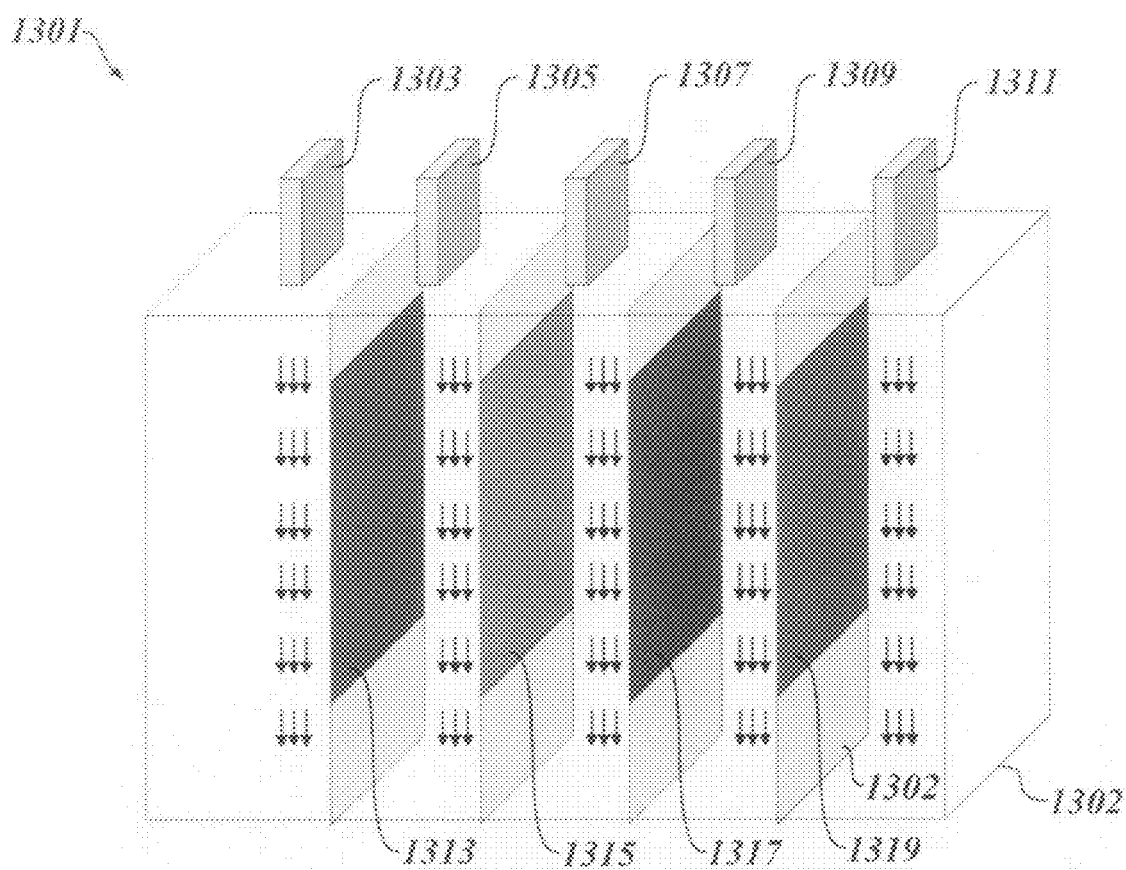
FIG. 21 is an illustration of an LCD assembly in accordance with the teachings herein.

FIG. 21 illustrates a particular, non-limiting embodiment of an LED optics assembly 1301 made in accordance with the teachings herein. As seen therein, the assembly includes a box 1302 within which are housed red 1313, blue 1317 and green 1319 LED arrays. A series of synthetic jet ejectors 1303, 1305, 1307, 1309 and 1311 are disposed in interdigitating relation to the LED arrays 1313, 1315, 1317 and 1319 such that a plurality of synthetic jets are directed along each major surface of the LED arrays 1313, 1315, 1317 and 1319.

Each of the LED arrays 1313, 1315, 1317 and 1319 in this particular embodiment are mounted on an optically clear substrate 1321, and are mounted on both sides of the substrate 1321. Consequently, the light density afforded by the assembly is very high. Cooling is accomplished on top of each die. The design of the LED optics assembly 1301 is modular. Hence, the design can be extended to have as many LED arrays as the system power and cooling will allow. The overall assembly can also be made more compact as the ability to stack multiple die allows the total area to shrink for the same light output. This design has optical benefits, since the light is easier to collect if the source is smaller in area. Of course, since the LED optics assembly 1301 is itself more compact, products incorporating the package can also be made smaller and more compact.

Figure 22:
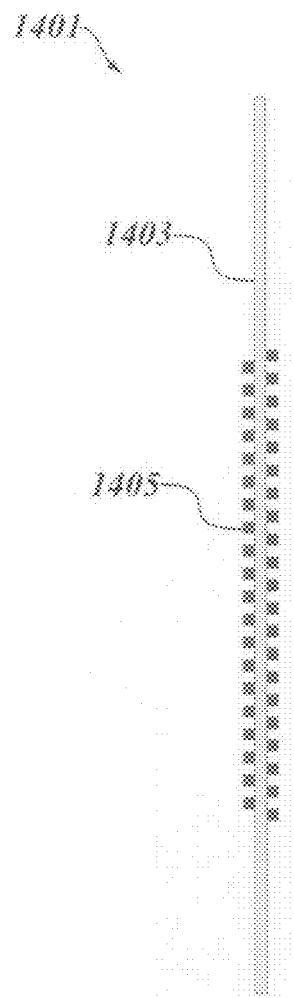
FIG. 22 is a side view illustration of a diode assembly in accordance with the teachings herein.
Figure 23:
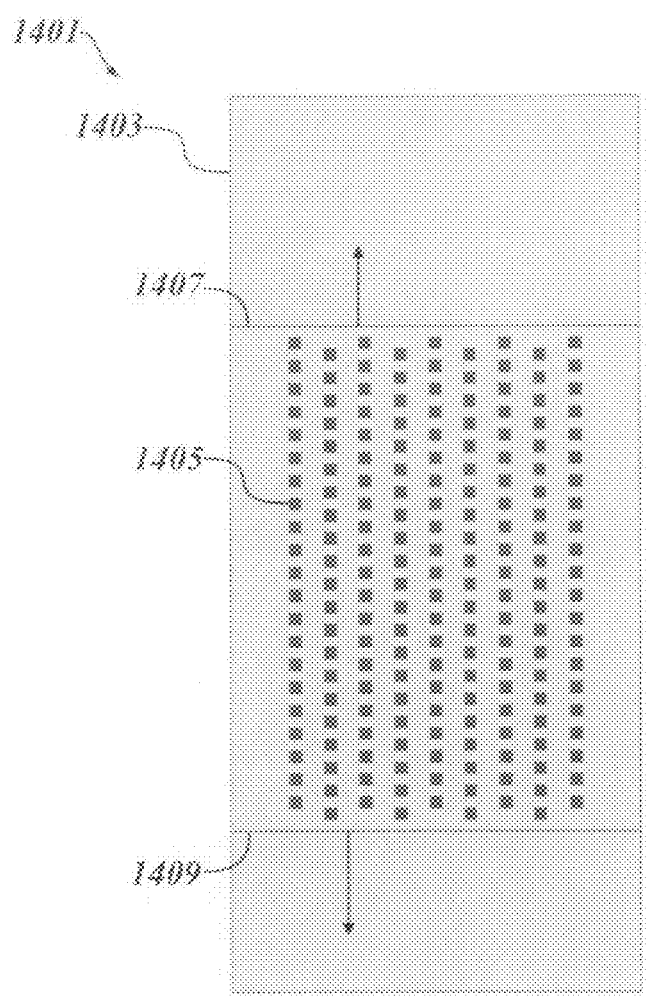
FIG. 23 is a side view illustration of a diode assembly in accordance with the teachings herein.

FIGS. 22-23 depict an LED array 1401 corresponding to the type of LED array 1313, 1315, 1317 and 1319 in the optics assembly 1301 of FIG. 21. As seen therein, the LED array comprises an optically clear substrate 1403, and a plurality of LEDs 1405 are mounted on each side of the substrate 1403. The LED array 1401 is further equipped with first 1407 and second 1409 terminal portions which provide electrical interconnection between the LED array 1401 and the power source and control circuitry (not shown) that operates the LED array 1401.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A device, comprising:
a first set of LED arrays adapted to emit light over a first principle bandwidth;
a second set of LED arrays adapted to emit light over a second principle bandwidth;
a third set of LED arrays adapted to emit light over a third principle bandwidth; and
a synthetic jet ejector;
wherein each member of said first, second, and third sets of LED arrays comprises a transparent, essentially planar substrate having a first light emitting surface with a first set of LEDs disposed thereon and a second light emitting surface with a second set of LEDs disposed thereon, wherein the members of said first, second and third sets of LED arrays are arranged in parallel, and wherein said synthetic jet ejector is adapted to emit a synthetic jet across the first or second light emitting surface of at least one member of at least one of said first, second and third sets of LED arrays.

2. The device of claim 1, further comprising a plurality of synthetic jet ejectors;
wherein each of said plurality of synthetic jet ejectors is adapted to emit a synthetic jet across the first or second light emitting surface of at least one member of at least one of said first, second and third sets of LED arrays.

3. The device of claim 2, wherein the first and second sets of LEDs transmit light along a common axis and in the same direction, and wherein the first set of LEDs are staggered with respect to the second set of LEDs such that the light emitted by the first set of LEDs is transmitted through the LED array upon which it is disposed.

4. The device of claim 2, wherein each member of said first, second, and third sets of LED arrays has a first synthetic jet ejector associated therewith which is adapted to emit a plurality of synthetic jets across said first surface of said member and has a second synthetic jet ejector associated therewith which is adapted to emit a plurality of synthetic jets across said second surface of said member.

5. The device of claim 2, wherein each member of said first, second, and third sets of LED arrays has a synthetic jet ejector associated therewith which is adapted to emit a first plurality of synthetic jets across said first surface of said member and a second plurality of synthetic jets across said second surface of said member.

6. The device of claim 1, wherein the LEDs in a first member of the first, second and third sets of LED arrays are staggered with respect to the LEDs in a second member of the first, second and third sets of LED arrays such that the light emitted by the LEDs in the first member are transmitted through the second member.

7. The device of claim 1, wherein the LEDs in any member of the first, second and third sets of LED arrays are staggered with respect to the LEDs in any other member of the first, second and third sets of LED arrays.

8. The device of claim 1, wherein the first set of LEDs are staggered with respect to the second set of LEDs.

9. The device of claim 1, wherein said first set of LED arrays is adapted to emit red light, wherein said second set of LED arrays is adapted to emit green light, and wherein said third set of LED arrays is adapted to emit blue light.

10. The device of claim 1, wherein said first, second and third sets of LED arrays are disposed in a liquid medium.

11. The device of claim 10, further comprising a plurality of synthetic jet ejectors, and wherein each of said plurality of synthetic jet ejectors is adapted to emit a plurality of synthetic jets between the opposing surfaces of an adjacent pair of LED arrays.

12. The device of claim 1, wherein each member of said first, second and third sets of LED arrays is centered on a common longitudinal axis and is adapted to emit light along said common longitudinal axis.

13. The device of claim 1, wherein each member of said first set of LED arrays is adapted to emit light in the red region of the visible spectrum, wherein each member of said second set of LED arrays is adapted to emit light in the blue region of the visible spectrum, wherein each member of said third set of LED arrays is adapted to emit light in the green region of the visible spectrum, and further comprising a dichroic filter disposed between said first and second sets of LED arrays.

14. The device of claim 13, wherein said dichroic filter reflects light in the blue and green regions of the spectrum, and transmits light in the red region of the spectrum.

15. The device of claim 14, wherein the device is adapted to emit light through a first end of the device, and further comprising a reflector disposed on a second end of the device.

16. The device of claim 1, wherein said first, second and third sets of LED arrays are disposed within a housing having a window therein, and wherein the interior of said housing has a reflective material disposed thereon.

17. A device, comprising:
a first set of LED arrays adapted to emit light over a first principle bandwidth;
a second set of LED arrays adapted to emit light over a second principle bandwidth;
a third set of LED arrays adapted to emit light over a third principle bandwidth; and
a plurality of synthetic jet ejectors;
wherein each member of said first, second, and third sets of LED arrays is disposed in a liquid medium and comprises a plurality of LEDs disposed on a transparent substrate, wherein at least one of said plurality of synthetic jet ejectors is adapted to emit a synthetic jet across a light emitting surface of at least one member of at least one of said first, second and third sets of LED arrays, and wherein at least one of said plurality of synthetic jet ejectors is adapted to emit a plurality of synthetic jets between the opposing surfaces of an adjacent pair of LED arrays.

18. The device of claim 17, wherein said plurality of synthetic jet ejectors is adapted to emit a plurality of synthetic jets between the opposing surfaces of any adjacent pair of LED arrays.

19. The device of claim 17, wherein each member of said first, second, and third sets of LED arrays has first and second major surfaces with first and second respective sets of LEDs disposed thereon.

20. The device of claim 19, wherein said plurality of synthetic jet ejectors is adapted to emit a first plurality of synthetic jets across the first major surface of each member of said first, second, and third sets of LED arrays, and wherein said plurality of synthetic jet ejectors is adapted to emit a second plurality of synthetic jets across the second major surface of each member of said first, second and third sets of LED arrays.

* * * * *